(12) United States Patent
Richards

(10) Patent No.: US 10,439,083 B1
(45) Date of Patent: Oct. 8, 2019

(54) FLEXIBLE GLASS SUPPORT FOR A SOLAR CELL ASSEMBLY

(71) Applicant: SolAero Technologies Corp., Albuquerque, NM (US)

(72) Inventor: Benjamin C. Richards, Albuquerque, NM (US)

(73) Assignee: SolAero Technologies Corp., Albuqurque, NM (US)

( * ) Notice: Subject to any disclaimer, the term of this patent is extended or adjusted under 35 U.S.C. 154(b) by 162 days.

(21) Appl. No.: 15/363,780

(22) Filed: Nov. 29, 2016

Related U.S. Application Data

(62) Division of application No. 14/306,008, filed on Jun. 16, 2014, now Pat. No. 9,577,129.

(51) Int. Cl.
| | |
|---|---|
| *H01L 31/00* | (2006.01) |
| *H01L 31/18* | (2006.01) |
| *H01L 31/042* | (2014.01) |
| *H01L 31/0392* | (2006.01) |
| *H01L 31/02* | (2006.01) |
| *H01L 31/05* | (2014.01) |

(52) U.S. Cl.
CPC .. *H01L 31/03926* (2013.01); *H01L 31/02008* (2013.01); *H01L 31/0504* (2013.01); *H01L 31/18* (2013.01)

(58) Field of Classification Search
CPC ............ H01L 31/03926; H01L 31/1896
See application file for complete search history.

(56) References Cited

U.S. PATENT DOCUMENTS

| | | |
|---|---|---|
| 4,755,231 A | 7/1988 | Kurland et al. |
| 5,298,085 A | 3/1994 | Harvey et al. |
| 8,107,777 B2 | 1/2012 | Farah |
| 2001/0017153 A1 | 8/2001 | Kubota et al. |
| 2010/0233838 A1* | 9/2010 | Varghese ............ H01L 21/6835 438/64 |
| 2013/0112239 A1 | 5/2013 | Liptac et al. |
| 2014/0021492 A1* | 1/2014 | Wolk ................. H01L 51/5275 257/88 |

OTHER PUBLICATIONS

Corning Willow Glass Fact Sheet, Corning Incorporated, 2016 (Year: 2016).*

* cited by examiner

*Primary Examiner* — Seahvosh Nikmanesh

(57) ABSTRACT

A method of bonding solar cell component to a support and the solar cell assembly thus obtained. The method of bonding solar cell component to a support comprises: disposing metallized traces on the support; dispensing bonding adhesive on front of the support or on back of the solar cell component; and laying down the solar cell component on the support and soldering the solar cell component to the metallized traces on the support. The support is a glass support with integrated circuits.

20 Claims, 3 Drawing Sheets

Intermediate Layer 203

US 10,439,083 B1

FLEXIBLE GLASS SUPPORT FOR A SOLAR CELL ASSEMBLY

BACKGROUND

Field of the Disclosure

The present disclosure relates to a solar cell assembly and a method of bonding a solar cell component to a support in order to manufacture a solar cell panel or array.

Description of the Related Art

Flexible solar panels and prototypes of such flexible solar panels have previously been made using supports consisting of either an open mesh or weave, such as Gore™ mesh, a woven fibreglass blanket, or a polymer film, such as Kapton™ polyimide film, Teflon™ films, PET or PEN films. Such supports can have certain drawbacks. For example, in some cases, they can be easily cut or punctured during handing or they may not provide adequate backside radiation protection for the solar cells. In some instances, they may be incompatible with high temperature processes, such as soldering. Further, if they are bent, creased, folded or bumped during handling, the material may retain a permanent deformation. Other problems may arise because the surface of the material is either porous (mesh/weave) or may not be very smooth on a microscopic scale (polyimide). In addition, some support materials may be susceptible to degradation from atomic oxygen (e.g., polyimide).

As an example, U.S. Pat. No. 5,298,085 discloses a support blanket for solar cell arrays which uses a fibreglass support. Further, U.S. Pat. No. 4,755,231 discloses a flexible solar array cell which uses a coated Kapton support. In addition, U.S. Pat. No. 8,107,777 discloses a polyimide support bonded to other support.

In view of the state of the art, a more advantageous solar cell assembly is desirable. The present disclosure describes a more advantageous solar cell assembly and method of making such a solar cell assembly.

SUMMARY

According to an aspect of the present disclosure, there is provided a method of bonding solar cell component to a support. The method includes disposing metallized traces on the support; dispensing bonding adhesive on front of the support or on back of the solar cell component; and laying down the solar cell component on the support and attaching (e.g., by soldering or conductive adhesive) the solar cell component to the metallized traces on the support. The support is a glass support with optional integrated traces.

According to a further aspect of the present disclosure, the method includes disposing a polyimide intermediate layer on the support with metallized traces before dispending the bonding adhesive.

According to a another aspect of the present disclosure, there is provided a solar cell assembly, including: a support with metallized traces; a solar cell component soldered to the metallized traces on the support; and bonding adhesive located between the support and the solar cell component. The support is a glass support with integrated circuits.

In some implementations, the glass has a bend stress less than about 200 millipascal for a bend radius greater than about 10 cm.

In some implementations, the glass has a thickness in a range of 50-200 μm.

In some implementations, the glass is composed of alkali-free borosilicate.

In some implementations, the glass has a thickness of no more than 100 μm.

In some implementations, the glass has a dielectric constant in a range of about 5-6.

In some implementations, the glass has a Young's modulus in a range of about 70-80 gigapascal (GPa).

In some implementations, the glass has a coefficient of thermal expansion (CTE) of 3-5 ppm/degree ° C.

In some implementations, the glass is Willow Glass™ manufactured by Corning, Inc.

Further aspects, features and advantages of the present invention will be apparent from the following description, the drawings, and the claims.

BRIEF DESCRIPTION OF THE DRAWINGS

The accompanying drawings, which are incorporated in and constitute a part of the specification, illustrate examples of various aspects of the invention and, together with the description, serve to explain various principles that pertain to some implementations.

DETAILED DESCRIPTION

Figure 1:
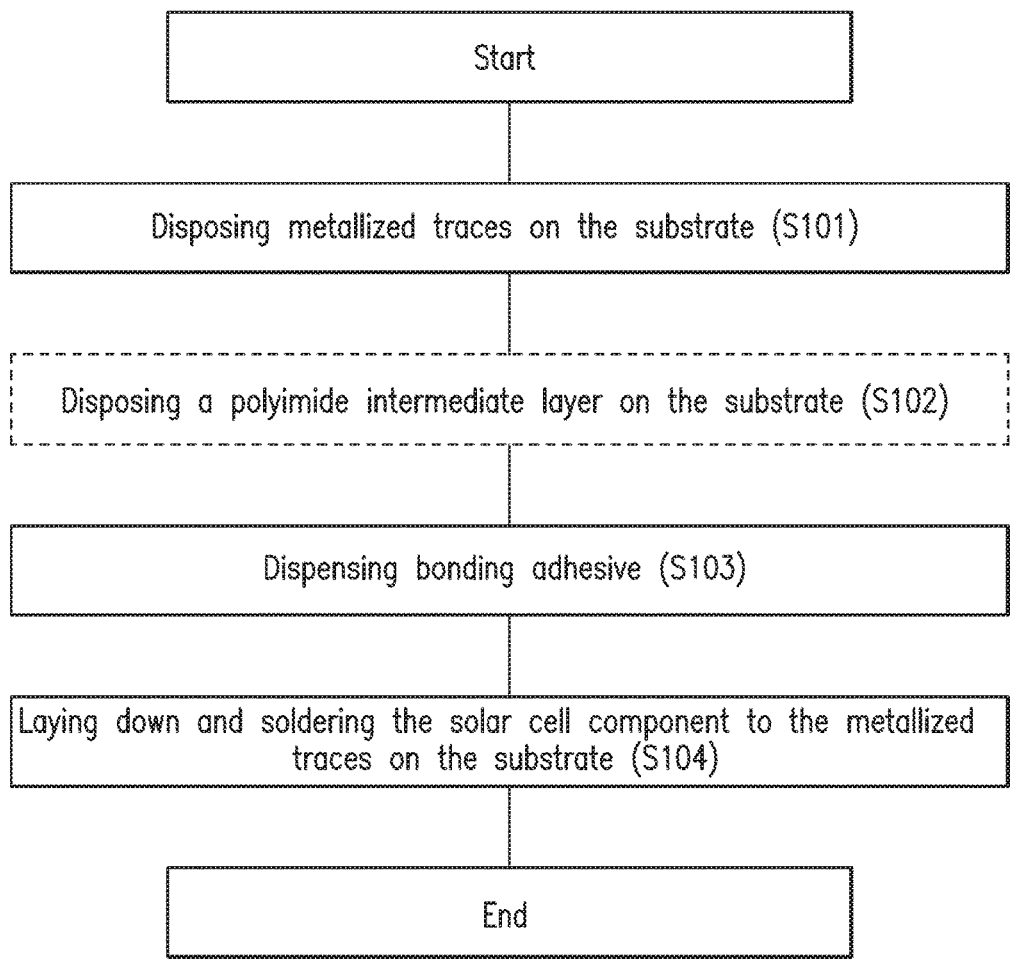
FIG. 1 is a simplified view schematically illustrating a method of bonding a solar cell component to a support.

Implementations of the present disclosure are described in detail below with reference to the drawings. Similar reference numerals are used to refer to similar elements throughout the drawings, and thus repetitive descriptions thereof are omitted.

FIG. 1 is a simplified view schematically illustrating a method of bonding a solar cell component to a support.

A glass support can be prepared in advance. It is preferable that the glass support is integrated with circuits. For example, in some implementations, the glass support's thickness ranges between 25 micrometers (μm) and 250 μm, and in some cases, the thickness is in the range of 50-200 μm. It is also preferable that the glass support is flexible. For example, the glass support can be made of Corning Willow Glass™.

A solar cell component also can be prepared in advance. The solar cell component can be, for example, an individual solar cell, a coverglass-interconnect-cell (CIC) assembly, a string of solar cells or a string of CICs. In a string of solar cells or a string of CICs, it is preferable that the solar cells or CICs are attached and connected together by welding, soldering, wire boding, conductive paste or the like. The solar cell component has bonding traces for connecting to a support.

At step S101, metallized traces are disposed on the support for the circuits integrated onto the glass support. In some implementations, the metallized traces are internal metallized traces, such that the metallized glass support has a flat surface.

In some instances, as indicated by step S102, a polyimide intermediate layer is disposed on the support with the metallized traces exposed through the gaps in the polyimide intermediate layer. Step S102 is optional and, in some cases, may be omitted.

Figure 3:
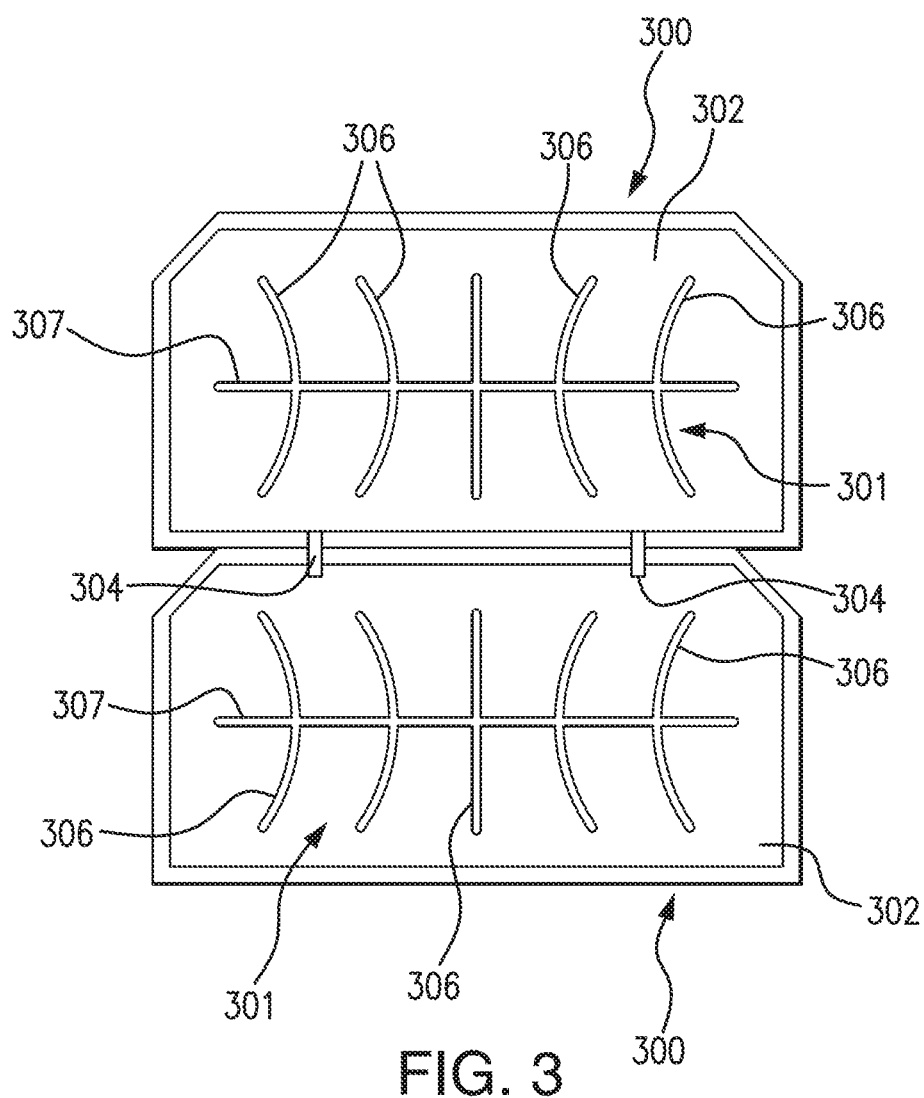
FIG. 3 illustrates an example of bonding adhesive patterns on the back of solar cells.

In some implementations, the top surface of each solar cell includes conductors that extend in parallel and function to make electrical contact with the top layer of the cell and collect charge when the surface is illuminated. The top surface of the cell also can include an electrically conducting bus, which extends along the periphery of the cell and which functions to electrically connect each of the conductors, and also to connect to electrical contacts on the top surface of the cell 300. As shown in FIG. 3, the bottom surface of each solar cell 300 can be covered substantially entirely with a metallic layer 302 so as to serve as a lower, or bottom surface (i.e., backside), metallic contact for the cell. Multiple cells 300 can be connected in series. This can be accomplished, for example, by using electrical interconnects 304 to connect the bottom surface of one cell in the series to electrical contacts on the top surface of the next cell.

At step S103, bonding adhesive is dispensed. The bonding adhesive can be dispensed, for example, on top of the support or on back of the solar cell component. The bonding adhesive can be dispensed in a pattern. For example, the bonding adhesive can be dispensed on the back of each solar cell 300 in a pattern 301 as illustrated in FIG. 3. The illustrated pattern 301 includes lines 306 of bonding adhesive intersecting a central line 307 of bonding adhesive that extends down the middle of the back of the solar cell 300. However, the pattern 301 of the bonding adhesive is not limited to the illustrated example, so long as the solar cells can be bonded to the flexible support. Instead of dispensing the bonding adhesive on back of the solar cells 300 as illustrated in FIG. 3, the bonding adhesive can be dispensed on top of a support. It is preferable that the bonding adhesive's viscosity ranges between 1000 millipascal-seconds and 50000 millipascal-seconds.

If the intermediate layer is disposed, the bonding adhesive can be dispensed on the intermediate layer. If the intermediate layer is not disposed, the bonding adhesive can be dispensed directly on the intermediate layer.

At step S104, the solar cell component is laid down onto the support, and the solar cell component is soldered to the metallized traces on the support. Soldering to the metal trace can be performed, for example, by wire bonding.

Figure 2A:
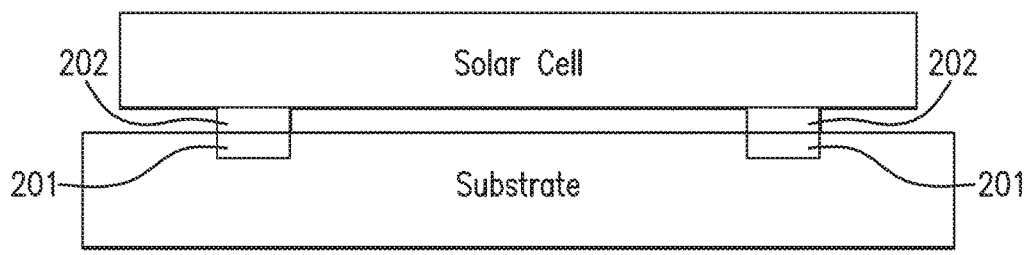
FIG. 2A and FIG. 2B are cross sectional views schematically illustrating solar cell assemblies.
Figure 2B:
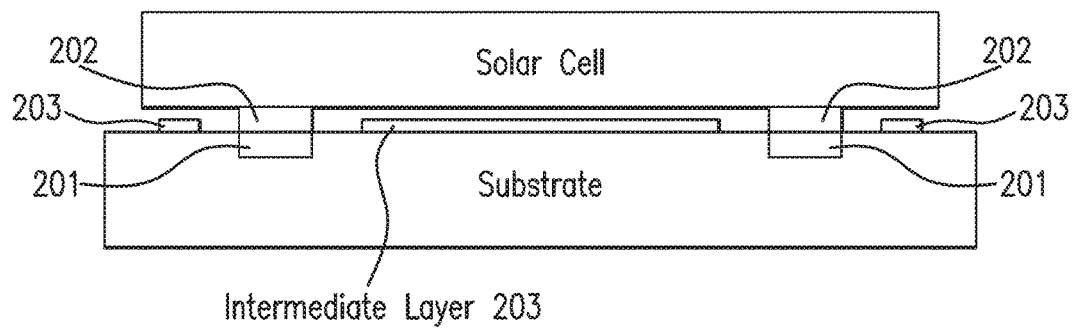

FIG. 2A and FIG. 2B are perspective views schematically illustrating examples of solar cell assemblies obtained by the foregoing method.

FIG. 2A illustrates the solar cell assembly including a support, a solar cell and the bonding adhesive (not shown) between the support and the solar cell. FIG. 2B illustrates the solar cell assembly including a support, an intermediate layer 203, a solar cell and the bonding adhesive (not shown) between the intermediate layer 203 and the solar cell.

In both FIG. 2A and FIG. 2B, the support is disposed with the metallized traces 201. It is preferable that the metallized traces are internal metallized traces 201 as illustrated by FIG. 2A and FIG. 2B. The metallized traces function to connect the corresponding traces of the solar cell. It is preferable that the traces of the solar cell are soldered to the metallized traces of the support by wire bonding.

The solar cell assembly described in this disclosure can be advantageous over the prior art. As compared with the meshes, weaves or polymer films, the glass support of this invention can, in some cases, provide increased radiation protection to the solar cell. Such radiation might be encountered, for example, on a satellite. As compared with the meshes, weaves or polymer films, the glass support of this invention can, in some implementations, be more mechanically robust and is not easily punctured or cut during handing. As compared with the meshes, weaves or polymer films, the glass support of this invention can, in some instance, also be resistant to a wide range of chemicals that may be used during cleaning or processing. As compared with the meshes, weaves or polymer films, the glass support of this invention can, in some cases, be compatible with higher temperatures, and such temperatures may be desirable for processing or for certain environments that the solar panel would encounter. As compared with the meshes, weaves or polymer films, the glass support of this invention can have a microscopically smoother surface, which may be preferable for bonding and other processes. In addition, the glass is transparent and may possess superior thermal characteristics for certain environments.

The terms "front," "back," "top," "bottom," "over," "under" and the like in this description and in the claims, if any, are used for descriptive purposes and not necessarily for describing permanent relative positions. The terms so used are interchangeable under appropriate circumstances such that the embodiments of the invention described herein are, for example, capable of operation in other orientations than those illustrated or otherwise described herein.

Furthermore, those skilled in the art will recognize that boundaries between the above described operations merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps than those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present invention can be implemented in various ways. The above described orders of the steps for the methods are only intended to be illustrative, and the steps of the methods of the present disclosure are not limited to the above specifically described orders unless otherwise specifically stated. The implementations of the present disclosure can be freely combined with each other without departing from the spirit and scope of the invention.

Although some specific implementations of the present invention have been demonstrated in detail with examples, a person skilled in the art would understand that the above examples are only intended to be illustrative but not to limit the scope of the present invention. It should be understood that the above embodiments can be modified without departing from the scope and spirit of the present invention which are to be defined by the attached claims. Accordingly, other implementations are within the scope of the claims.

What is claimed is:

1. A solar cell assembly, comprising:
a support with metallized traces;
a solar cell component electrically coupled to the metallized traces on the support; and
bonding adhesive located between the support and the solar cell component;
wherein the support is a flexible glass support and wherein the electrical coupling between the metallized traces and the solar cell component results from welding, wire bonding, solder, or electrically conductive paste.

2. The solar cell assembly of claim 1, further comprising a polyimide intermediate layer disposed between the support and the bonding adhesive.

3. The solar cell assembly of claim 1, wherein the metalized traces are on the surface of the support.

4. The solar cell assembly of claim 1, wherein the support is composed of alkali-free borosilicate and has a bend stress less than about 200 millipascal for a bend radius greater than about 10 cm; a thickness in a range of 50-200 μm; a dielectric constant in a range of about 5-6; a Young's modulus in a range of about 70-80 gigapascal; and a coefficient of thermal expansion (CTE) of 3-5 ppm/degree ° C.

5. The solar cell assembly of claim 1, wherein the support has a thickness between 25 μm and 250 μm.

6. The solar cell assembly of claim 1, wherein the glass support comprises alkali-free borosilicate.

7. The solar cell assembly of claim 1, wherein the metallized traces are internal to the glass support.

8. The solar cell subassembly of claim 1, wherein the glass support has a bend stress less than 200 millipascal for a bend radius greater than 10 cm.

9. The solar cell subassembly of claim 1, wherein the solar cell component includes: an individual solar cell, a coverglass-interconnect-cell (CIC) assembly, a string of solar cells, or a string of CICs.

10. The solar cell subassembly of claim 1, wherein the solar cell component includes a plurality of solar cells connected in series, wherein an electrical interconnect connects a bottom surface of one of the solar cells to an electrical contact on a top surface of another one of the solar cells.

11. The solar cell subassembly of claim 1, wherein conductive contacts of the solar cell are soldered to the metallized traces on the support.

12. The solar cell subassembly of claim 1, wherein conductive contacts of the solar cell are wire bonded to the metallized traces on the support.

13. A solar cell assembly, comprising:
a flexible glass support having metallized traces, the flexible glass support having a bend stress less than 200 millipascal for a bend radius greater than 10 cm;
a solar cell component electrically coupled to the metallized traces with welding or electrically conductive paste;
bonding adhesive located between the support and the solar cell component; and
a polyimide intermediate layer disposed between the support and the bonding adhesive.

14. The solar cell assembly of claim 13, wherein the flexible glass support is composed of alkali-free borosilicate.

15. The solar cell assembly of claim 13 wherein the flexible glass support has a thickness in a range of 50-200 μm.

16. The solar cell assembly of claim 13 wherein the flexible glass support has a dielectric constant in a range of about 5-6.

17. The solar cell assembly of claim 13 wherein the flexible glass support has a Young's modulus in a range of about 70-80 gigapascal.

18. The solar cell assembly of claim 13 wherein the flexible glass support has a coefficient of thermal expansion (CTE) of 3-5 ppm/degree ° C.

19. The solar cell subassembly of claim 13, wherein the solar cell component includes: an individual solar cell, a coverglass-interconnect-cell (CIC) assembly, a string of solar cells, or a string of CICs.

20. The solar cell subassembly of claim 13, wherein the solar cell component includes a plurality of solar cells connected in series, wherein an electrical interconnect connects a bottom surface of one of the solar cells to an electrical contact on a top surface of another one of the solar cells.

* * * * *